HIGH IMPEDANCE TRANSISTOR CIRCUITS

Original Filed May 7, 1956

INVENTORS,
RUDOLF A. STAMPFL &
RUDOLF A. HANEL.
BY
Harry M. Saragovitz
ATTORNEY.

United States Patent Office

2,942,200

Patented June 21, 1960

2,942,200

HIGH IMPEDANCE TRANSISTOR CIRCUITS

Rudolf A. Hanel, Eatontown, and Rudolf A. Stampfl, Interlaken, N.J., assignors to the United States of America as represented by the Secretary of the Army

Original application May 7, 1956, Ser. No. 583,341, now Patent No. 2,881,269, dated Apr. 7, 1959. Divided and this application Feb. 26, 1959, Ser. No. 807,744

4 Claims. (Cl. 330—18)

(Granted under Title 35, U.S. Code (1952), sec. 266)

The invention described herein may be manufactured and used by or for the Government for governmental purposes, without the payment of any royalty thereon.

This application is a division of application Serial No. 583,341, filed May 7, 1956, now Patent No. 2,881,269.

This invention relates to electronic devices and particularly to those in which the active elements are transistors.

An object of the invention is to increase the input impedance obtainable with transistor amplifiers.

In accordance with the invention a common collector transistor input stage is provided with a feedback circuit whereby the collector voltage is made to follow the input signal impressed on the base. This prevents the normal base-collector signal voltage fields from forming. In the absence of the fields no signal current flows, a condition which if perfect provides infinite collector impedance. And collector impedance, it has been observed, is the principal limitation on extending the input impedance of the common collector amplifier. The expression common collector amplifier or stage, as used in the specification and claims, is deemed to include amplifiers which include a semiconductor device having at least three elements which function as base, emitter, and collector elements, respectively, and in which the input signal is injected on the base element and the output signal taken off the emitter element.

For a better understanding of the invention, together with other objects thereof, reference is had to the following description taken in connection with the accompanying drawings, in which:

Figure 1 is a schematic circuit diagram of an embodiment of the invention;

Figures 2*a*–2*c* are equivalent circuit diagrams of the circuit shown in Figure 1;

The numbering system employed is common to all three diagrams of embodiments of the invention insofar as common elements appear.

Figure 1:
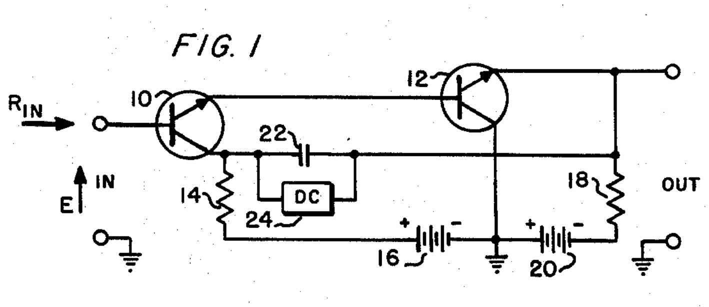

In Figure 1, NPN transistors 10 and 12 are connected in common collector fashion with the emitter of transistor 10 directly connected to the base of transistor 12. Collector load resistor 14 is connected between the positive terminal of collector bias source 16 and the collector of transistor 10. Emitter load resistor 18 is connected between the negative terminal of emitter bias source 20 and the emitter of transistor 12. The collector of transistor 12 is connected to ground, to which the negative terminal of bias source 16 and positive terminal of bias source 20 are also connected. Coupling capacitor 22 providing an alternating current (A.C.) feedback path and coupling element 24, in the form of a battery or equivalent D.C. source, providing a D.C. feedback path, are connected between the emitter of transistor 12 and the collector of transistor 10. For A.C. amplification only, potential source 24 is not necessary. Source 24 may be used without the capacitor for combined A.C. and D.C. operation provided its internal impedance is quite low. The voltage and polarity of the potential source 24 should be the same as the observed static voltage difference and polarity between collector of transistor 10 and the emitter of transistor 12 with source 24 disconnected.

In operation, when a positive voltage is applied to the base of transistor 10 the in-phase emitter voltage rises with it and normally the out-of-phase collector voltage would drop due to the increase in voltage drop across the collector resistor 14. However in accordance with the invention the emitter output voltage from transistor 10 is fed to the base of transistor 12 and the emitter output of this transistor is coupled in phase through feedback capacitor 22 and potential source 24 back to the collector of transistor 10, and thus the out-of-phase voltage change tendency on the collector is overcome and the collector voltage is caused to substantially follow the input base voltage. As previously stated it is this result which produces the higher impedance input.

Figure 2A:
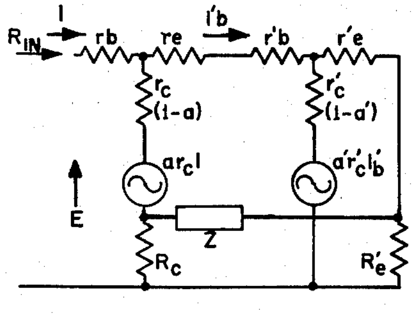
Figure 2B:
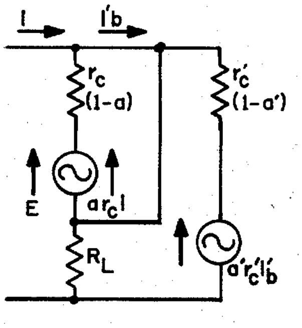
Figure 2C:
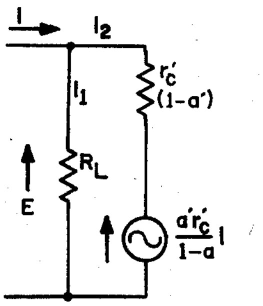

The effectiveness of the invention may perhaps be best illustrated by analysis of its equivalent circuits shown in Figures 2*a*, 2*b* and 2*c*, in which:

$I$=input current
$I_1$=current through the first path in Figure 2*c*
$I_2$=current through the second path in Figure 2*c*
$E$=input voltage
$r_b$=base resistance of transistor 10
$r_e$=emitter resistance of transistor 10
$r_c$=collector resistance of transistor 10
$a$=current amplification factor of transistor 10
$R_c$=collector load resistance of transistor 10
$R'_e$=emitter load resistance of transistor 12
$I'_b$=base current through transistor 12
$Z$=impedance of the feedback coupling circuit Other primed symbols refer to the elements of transistor 12.

The circuit shown as Figure 2*a* contains a complete equivalent circuit of Figure 1. It is assumed that:

$(r_e+r_b)$ and $(r'_e+r'_b)\ll r_c(1-a)$ or $r'_c(1-a')$ or $R_cR'_e/R_c+R_c+R'_e$, and that within the bandpass: $Z\ll r_c(1-a)$ or $R_cR'_e/R_c+R'_e$ or $r_c(1-a')$.

Eliminating $r_e$, $r_b$, $r'_e$, $r'_b$ and $Z$ and redesignating $R_cR'_e/R_c+R'_e$ as $R_L$ the equivalent circuit may be rewritten as in Figure 2*b*.

Since the base current of the second transistor is the current output of the first transistor, following the formula for current gain in a common collector stage, where the output load is small, $I/(1-a)$ may be substituted for the base current $I_b$. In addition the terms $r_c(1-a)$ and $ar_cI$, which are effectively shorted out, may be omitted. Again redrawing, we have the final equivalent circuit shown in Figure 2*c*. From it, the following equations can be solved and the equation for input impedance, $E/I$, written.

$$I=I_1+I_2 \tag{1}$$

$$I=\frac{E}{R_L}+I_2 \tag{2}$$

$$E=r_c(1-a)I_2+\frac{a'r_c}{1-a} \tag{3}$$

$$I_2=I-\frac{E}{R_L} \tag{4}$$

Substituting for $I_2$ in Equation 3, $$E=r_c(1-a)\left(I-\frac{E}{R_L}\right)+\frac{a'r_c}{1-a} \tag{5}$$

$$E/I \text{ os } R_{in}=\frac{1-a+aa'}{(1-a)(1-a')}\cdot\frac{R_Lr'_c(1-a')}{R_L+r'_c(1-a')} \tag{6}$$

Figure 3:
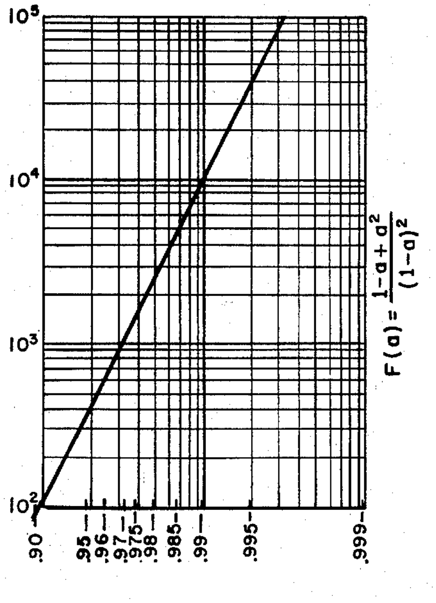
Figure 3 is a graph illustrated of certain properties of the invention.

Values for the first term in Equation 6 for values of $a$, assuming $a=a'$, may be read from the graph in Figure 3. For example with a value of .99 for $a$, the first term will equal approximately 10,000. The second term is $R_L$ shunted with $r'_c(1-a)$, and with a readily obtainable value of 50,000 for each of these resistances the term value would be 25,000. Multiplied we obtain an input impedance of 250 megohms.

The above theoretical analysis has been generally substantiated in practice as input impedances of circuits built in accordance with it have been measured at approximately 200 megohms.

Figure 4:
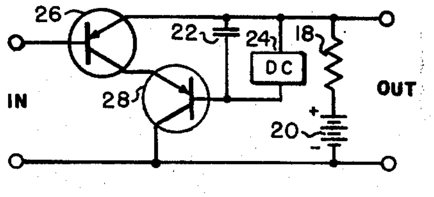
Figures 4 and 5 are schematic circuit diagrams of other embodiments of the invention.

The embodiment of the invention shown in Figure 4 is similar and functions in substantially the same manner as the one just described. It is however designed without separate collector and emitter load resistors and bias sources. In Figure 1, the emitter of transistor 10 is directly connected to the base of transistor 12. In Figure 4, the emitter of transistor 26 is indirectly connected to the base of transistor 28 through capacitor 22 and D.C. source 24. In Figure 1 the emitter of transistor 12 is indirectly connected to the collector of transistor 10 through capacitor 22 and D.C. source 24. In Figure 4 the emitter of transistor 28 is directly connected to the collector of transistor 26. As shown in Figure 4 the transistors 26 and 28 are of the PNP type.

Figure 5:
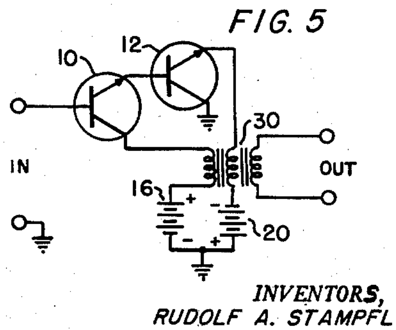

In Figure 5 the basic circuit of Figure 1 is modified in that the feedback and output voltages are transferred by transformer 30. The transformer has three windings, viz., a collector winding connected to transistor 10, an emitter winding connected to transistor 12, and an output winding. Appropriate feedback may be obtained with a ratio of one to one between collector and emitter windings. In all of the circuits shown either NPN or PNP type transistors may be used. If desired, one NPN type and one PNP type may be used in combination. It is of course necessary to reverse the biasing potentials from those shown where substitutions are made.

While there has been described what is at present considered a preferred embodiment of the invention, it will be obvious to those skilled in the art that various changes and modifications may be made therein without departing from the invention, and it is aimed in the appended claims to cover all such changes and modifications as fall within the true spirit and scope of the invention.

What is claimed is:

1. An amplifying system comprising first and second transistors, each comprising base, emitter and collector elements, the emitter element of said first transistor being connected to the base element of said second transistor, first and second resistors, one end of said first resistor being connected to the collector element of said first transistor, one end of said second resistor being connected to the said emitter element of said second transistor, first and second D.C. bias sources, one terminal of said first bias source being connected to the other end of said first resistor, one terminal of said second bias source being connected to the other end of said second resistor, the opposite terminal of said first bias source, the opposite terminal of said second bias source and the collector element of said second transistor all being connected to a common terminal, said bias sources being poled to apply normal collector operating biases on the collector elements of said transistors, signal coupling means being connected between the collector element of said first transistor and the emitter element of said second transistor for impressing the voltage from said emitter of said second transistor upon the collector of said first transistor, and a pair of input terminals being connected between the base element of said first transistor and said common terminal.

2. An amplifying system comprising first and second NPN transistors, each comprising base, emitter and collector elements, the emitter element of said first transistor being connected to the base element of said second transistor, first and second resistors, one end of said first resistor being connected to the collector element of said first transistor, one end of said second resistor being connected to the said emitter element of said second transistor, first and second D.C. bias sources, the positive terminal of said first bias source being connected to the other end of said first resistor, the negative terminal of said second bias source being connected to the other end of said second resistor, the opposite terminal of said first bias source, the opposite terminal of said second bias source and the collector element of said second transistor all being connected to a common terminal, a capacitor and a D.C. source being connected in parallel between the collector element of said first transistor and the emitter element of said second transistor, said D.C. bias source exhibiting the same potential as the static potential across said capacitor without said D.C. bias source, a pair of input terminals being connected between the base element of said first transistor and the said common terminal, and a pair of output terminals being connected between the emitter element of the said second transistor and said common terminal.

3. An amplifying system comprising a first and second transistor, each comprising base, emitter and collector elements, the emitter element of said first transistor being connected to the base element of said second transistor, a transformer comprising a first, and second windings, a first and second biasing sources, one end of said first transformer winding being connected to the collector element of said first transistor and the other end being connected to a first terminal of said first biasing source, one end of said second transformer winding being connected to the emitter element of said second transistor and the other end being connected to a first terminal of said second biasing source, connections to said windings being arranged to cause phase opposition between signal voltages appearing across said windings, the opposite terminal of said first biasing source and the opposite terminal of said second biasing source being connected to a common terminal, the collector of said second transistor being connected to said common terminal, said first biasing source being poled to apply normal operating bias to said collector of said first transistor and said second biasing source being poled to apply normal operating bias to said emitter of said second transistor, a pair of input terminals being connected between the base element of said first transistor and said common terminal, and a pair of output terminals electrically coupled between the emitter element of said second transistor and said common terminal.

4. An amplifying system comprising a first and second NPN transistor, each comprising base, emitter and collector elements, the emitter element of said first transistor being directly connected to the base element of said second transistor, a transformer comprising a first, second, and third windings, a first and second biasing sources, one end of said first transformer winding being connected to the collector element of said first transistor and the other end being connected to the positive terminal of said first biasing source, one end of said second transformer winding being connected to the emitter elements of said second transistor and the other end being connected to the negative terminal of said second biasing source, connections to said first and second windings being arranged to provide phase opposition between the voltages impressed across said first and second windings, output terminals being connected to the ends of said third transformer winding, the negative terminal of said first biasing source and the positive terminal of said second biasing source being connected to a common terminal, the collector of said second transistor being connected to said common terminal, and a pair of input terminals being connected to the base element of the base of said first transistor and said common terminal.

References Cited in the file of this patent

UNITED STATES PATENTS

| | | |
|---|---|---|
| 2,794,076 | Shea | May 28, 1957 |
| 2,801,298 | Mital | July 30, 1957 |
| 2,858,379 | Stanley | Oct. 28, 1958 |